(12) United States Patent
Demircan et al.

(10) Patent No.: US 8,431,970 B2
(45) Date of Patent: Apr. 30, 2013

(54) INTEGRATED CIRCUITS WITH EDGE-ADJACENT DEVICES HAVING REACTANCE VALUES

(75) Inventors: Ertugrul Demircan, Austin, TX (US); Jack M. Higman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 204 days.

(21) Appl. No.: 12/884,807

(22) Filed: Sep. 17, 2010

(65) Prior Publication Data

US 2011/0001214 A1 Jan. 6, 2011

Related U.S. Application Data

(62) Division of application No. 11/689,657, filed on Mar. 22, 2007, now Pat. No. 7,820,520.

(51) Int. Cl.
*H01L 29/00* (2006.01)

(52) U.S. Cl.
USPC ............ 257/232; 257/48; 257/531; 257/620; 257/773; 257/E21.014

(58) Field of Classification Search ............... 257/532, 257/531, 620, 688, 773, 409, E21.014, 48
See application file for complete search history.

(56) References Cited

U.S. PATENT DOCUMENTS

| | | | | |
|---|---|---|---|---|
| 6,492,716 | B1 * | 12/2002 | Bothra et al. | 257/678 |
| 6,600,181 | B2 * | 7/2003 | Otake et al. | 257/277 |
| 6,847,066 | B2 * | 1/2005 | Tahara et al. | 257/243 |

* cited by examiner

*Primary Examiner* — Michael Trinh
(74) *Attorney, Agent, or Firm* — Sherry W. Schumm

(57) ABSTRACT

An integrated circuit has a plurality of terminals for making electrical connection to the integrated circuit. At least one device is formed adjacent an outer edge of the integrated circuit. The device includes at least one metal conductor for forming an edge seal for protecting the integrated circuit during die singulation. The device is coupled to one or more functional circuits within the integrated circuit by routing the at least one metal conductor to the one or more functional circuits, the at least one device providing a reactance value to the one or more functional circuits for non-test operational use. The device may be formed as one or more capacitors or as one or more inductors. Various structures may be used for the capacitor and the inductor.

16 Claims, 3 Drawing Sheets

US 8,431,970 B2

INTEGRATED CIRCUITS WITH EDGE-ADJACENT DEVICES HAVING REACTANCE VALUES

BACKGROUND

1. Field

This disclosure relates generally to a semiconductor device, and more specifically, to a semiconductor device with a capacitor and/or an inductor.

2. Related Art

Many semiconductor die use an edge seal around the periphery of the die to protect the die during singulation. When the die are singulated (e.g. by sawing or using another method to separate the die from the other die on the wafer), the edge seal acts as a barrier to prevent cracks or contaminants from propagating past the edge seal into the active circuitry of the die. Such cracks or contaminants could cause the circuitry on the die to become nonfunctional if the cracks or contaminants were not stopped by the edge seal. Some other common terms for edge seal are seal ring or crack stop. As used herein, the term edge seal encompasses any structure that is used as a physical barrier to protect a die during singulation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

It is often desirable to use one or more decoupling capacitors in conjunction with the circuitry formed on integrated circuits in order to filter or reduce the voltage fluctuations or noise on the power supply conductors. Generally integrated circuits have a first power supply voltage that is approximately ground (e.g. VSS), and a second power supply voltage that is at a higher potential (e.g. VDD) that is used to power functional circuitry (e.g. a processor). Some integrated circuits have more than two power supply voltages (e.g. a higher programming voltage for certain nonvolatile memory). In addition, the input/output (I/O) circuitry used to drive signals off chip may use a power supply voltage that is higher than VDD.

Prior art has often used discreet capacitors to provide the desired decoupling capacitance, which adds cost and increases packaging size. Some prior art has used valuable semiconductor area to form the decoupling capacitors on the die. Unfortunately, the decoupling capacitance desired is often large, and thus requires a large amount of area on the semiconductor and may add complexity to the manufacturing process used to form the semiconductor device. Also, note that reactance is the imaginary part of impedance and is caused by the presence of an inductor and/or a capacitor in a circuit.

Figure 1:
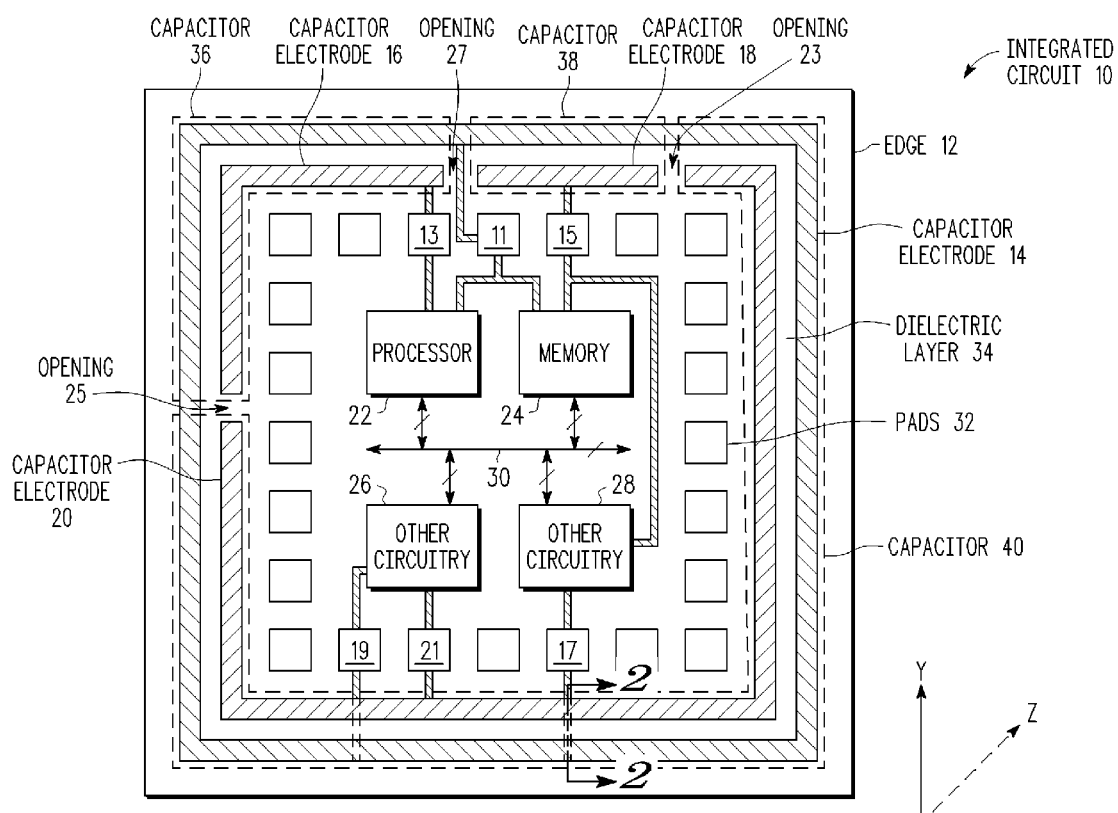
FIG. 1 illustrates, in a partial top view and a partial block diagram form, a semiconductor device having a plurality of capacitors in accordance with one embodiment of the present invention.

Referring to FIG. 1, a semiconductor device 10 has an edge 12 and an edge seal region around the periphery of the semiconductor device 10 between the edge 12 and the pads 32. In one embodiment, the semiconductor device 10 is an integrated circuit. The periphery of integrated circuit 10 comprises a plurality of capacitors 36, 38, and 40 separated by openings 27, 23, and 25, respectively. In the illustrated embodiment, capacitor electrode 14 also functions as an edge seal 14 which acts as a barrier to prevent cracks or contaminants from propagating past the edge seal 14 into the active circuitry of the die. Note that capacitor electrodes 16, 18, and 20 may also be used as an edge seal, although the breaks between these electrodes may compromise their barrier capability. However, since electrode 14 provides a continuous barrier, the breaks in electrodes 16, 18, and 20 do not compromise the integrity of integrated circuit 10. In alternate embodiments, the first electrode may be implemented as a continuous segment without breaks or may be implement as a plurality of electrically isolated segments. In alternate embodiments, the second electrode may be implemented as a continuous segment or may be implemented as a plurality of electrically isolated segments. Continuous or segmented embodiments of both first and second electrodes may be combined in any desired manner, as long as the first and second electrodes function as a sufficient edge barrier to protect integrated circuit 10 from singulation defects such as cracks or contaminants.

In the illustrated embodiment, capacitor 36 is formed having a first electrode 14 and a second electrode 16. Electrodes 14 and 16 are conductive, whereas the intervening material between electrodes 14 and 16 acts as a dielectric. Thus, the combination of conductive electrode 14 and conductive electrode 16 with interposing dielectric layer 34 forms a capacitor 36. The capacitance of capacitor 36 is determined by a plurality of factors, such as, for example, the distance between conductive electrodes 14 and 16, the effective dielectric constant of the interposing material (e.g. layer 34) between conductive electrodes 14 and 16, the common run length of conductive electrodes 14 and 16 (x and y dimensions), and the vertical distance that conductive electrodes 14 and 16 overlap (z dimension).

In the illustrated embodiment, capacitor 38 is formed having a first electrode 14 and a second electrode 18. Electrodes 14 and 18 are conductive, whereas the intervening material between electrodes 14 and 18 acts as a dielectric. Thus, the combination of conductive electrode 14 and conductive electrode 18 with interposing dielectric layer 34 forms a capacitor 38. The capacitance of capacitor 38 is determined by a plurality of factors, such as, for example, the distance between conductive electrodes 14 and 18, the effective dielectric constant of the interposing material (e.g. layer 34) between conductive electrodes 14 and 18, the common run length of conductive electrodes 14 and 18 (x and y dimensions), and the vertical distance that conductive electrodes 14 and 18 overlap (z dimension).

In the illustrated embodiment, capacitor 40 is formed having a first electrode 14 and a second electrode 20. Electrodes 14 and 20 are conductive, whereas the intervening material between electrodes 14 and 20 acts as a dielectric. Thus, the combination of conductive electrode 14 and conductive electrode 20 with interposing dielectric layer 34 forms a capacitor 40. The capacitance of capacitor 40 is determined by a plurality of factors, such as, for example, the distance between conductive electrodes 14 and 20, the effective dielectric constant of the interposing material (e.g. layer 34) between conductive electrodes 14 and 20, the common run length of conductive electrodes 14 and 20 (x and y dimensions), and the vertical distance that conductive electrodes 14 and 20 overlap (z dimension).

In the illustrated embodiment, semiconductor device 10 comprises functional circuitry, including processor 22, memory 24, other circuitry 26, and other circuitry 28 which are bi-directionally coupled to a bus 30 for communicating between the various portions of functional circuitry. In the illustrated embodiment, processor 22 and capacitor electrode 14 are coupled to each other and to VSS by way of pad 11. Similarly, in the illustrated embodiment, processor 22 and capacitor electrode 16 are coupled to each other and to a higher power supply voltage by way of pad 13. Likewise, in the illustrated embodiment, memory 24 and capacitor electrode 14 are coupled to each other and to VSS by way of pad 11. Similarly, in the illustrated embodiment, memory 24 and capacitor electrode 18 are coupled to each other and to a higher power supply voltage by way of pad 15. Note that by providing a power supply voltage by way of different pads 13, 15, it is possible to provide different power supply voltages to processor 22 and memory 24. For example, processor 22 may use its higher power supply voltage for powering its functional circuitry, whereas memory 24 may use its higher power supply voltage for programming nonvolatile memory.

In the illustrated embodiment, memory 24 and capacitor electrode 14 are coupled to each other and to VSS by way of pad 11. Similarly, in the illustrated embodiment, memory 24 and capacitor electrode 18 are coupled to each other and to a higher power supply voltage by way of pad 15. Note that capacitors 36 and 38 provide decoupling capacitance between the power supply voltage provided to processor 22 by way of pad 13 and the power supply voltage provided to memory 24 by way of pad 15.

In the illustrated embodiment, other circuitry 28 and capacitor electrode 14 are coupled to each other and to VSS by way of pad 17. Similarly, in the illustrated embodiment, other circuitry 28 and capacitor electrode 18 are coupled to each other and to a higher power supply voltage by way of pad 15. Also, in the illustrated embodiment, other circuitry 26 and capacitor electrode 14 are coupled to each other and to VSS by way of pad 19. Similarly, in the illustrated embodiment, other circuitry 26 and capacitor electrode 20 are coupled to each other and to a higher power supply voltage by way of pad 21. Note that by providing a power supply voltage by way of different pads 15 and 21, it is possible to provide different power supply voltages to other circuitry 26 and 28. For example, other circuitry 26 may use its higher power supply voltage for powering specialized circuitry (e.g. an analog to digital converter), whereas other circuitry 28 may use its higher power supply voltage for powering I/O circuitry to provide signals external to device 10.

In the illustrated embodiment, other circuitry 26 and other circuitry 28 are coupled to each other and to VSS by way of capacitor electrode 14 and pads 17 and 19. Note that capacitors 38 and 40 provide decoupling capacitance between the power supply voltage provided to other circuitry 26 by way of pad 19 and the power supply voltage provided to other circuitry 28 by way of pad 17.

In alternate embodiments, one or more of capacitors 36, 38, and 40 may be used for other purposes aside from decoupling.

For example, one or more of capacitors 36, 38, and 40 may be used as part of the functional circuitry within circuits 22, 24, 26, and/or 28. In this embodiment, a pad may or may not be used, as it is not necessary that power or ground be coupled to either terminal of capacitors 36, 38, and 40.

Alternate embodiments may use any amount or type of functional circuitry. Circuits 22, 24, 26, and 28 are just some examples of functional circuitry. Alternate embodiments may use any number of pads 32 and any number of capacitors 36, 38, and 40. The placement of pads in FIG. 1 illustrates one possible arrangement and alternate embodiments may use different arrangements. The pads are conductors on the semiconductor device which are provided to be contacted by conductors outside the semiconductor device.

Figure 2:
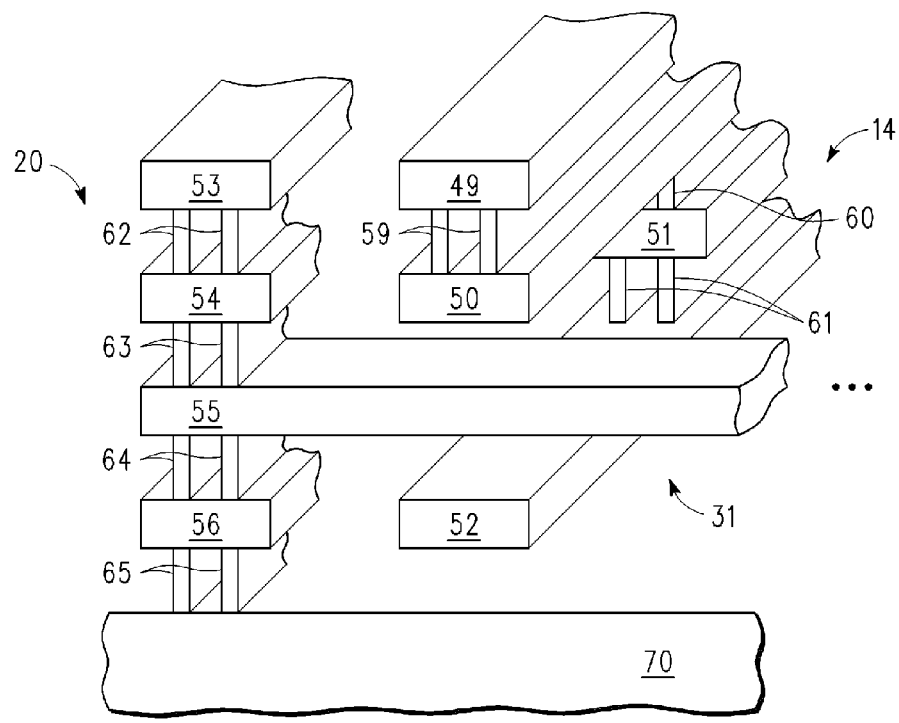
FIG. 2 illustrates, in a cross-sectional view, a portion of a semiconductor device of FIG. 1 or FIG. 4 forming a capacitor or inductor in accordance with one embodiment of the present invention.
Figure 4:
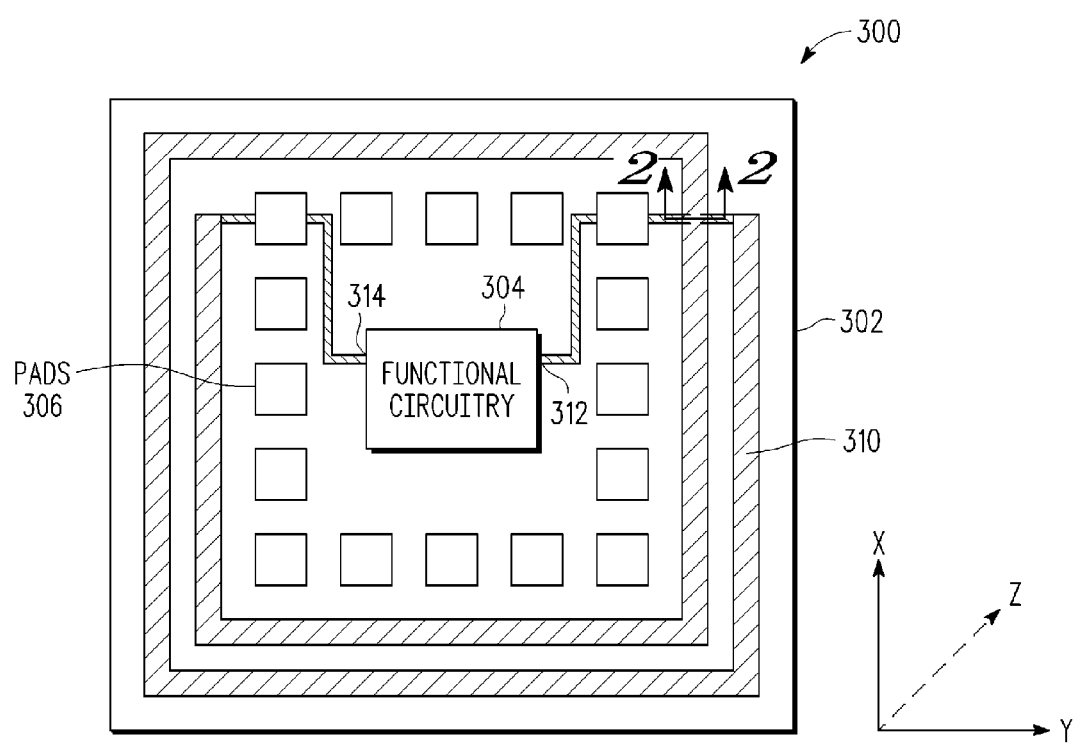
FIG. 4 illustrates, in a partial top view and a partial block diagram form, an alternate embodiment of a semiconductor device having an inductor in accordance with one embodiment of the present invention.

FIG. 2 illustrates, in a cross-sectional view, a portion of integrated circuit 10 of FIG. 1 or integrated circuit 300 of FIG. 4 forming a device (e.g. capacitor or inductor) in accordance with one embodiment of the present invention. Note that in the illustrated embodiment, electrode 20 is formed as a conductive stack that is comprised of a plurality of conductive layers 53-56 which are electrically connected by way of vias 62-65. Note that conductive layers 53-56 may be formed using the same conductive layers that also form the conductive interconnect in circuits 22, 24, 26, and 28 of FIG. 1 and circuit 304 of FIG. 4. In most embodiments, these conductive layers 53-56 are metal (e.g. copper, aluminum, etc); however, alternate embodiments may use any appropriate conductive material or stack of materials. Note that vias 62-65 may be formed using the same conductive layers that also form the conductive vias in circuits 22, 24, 26, and 28 of FIG. 1 and circuit 304 of FIG. 4. In most embodiments, these conductive vias 62-65 are metal (e.g. copper, tungsten, titanium, aluminum, etc); however, alternate embodiments may use any appropriate conductive material or stack of materials.

Note that in the illustrated embodiment, electrode 14 is formed as a conductive stack comprises a plurality of conductive layers 49-52 which are electrically connected by way of vias 59-61. Note that conductive layers 49-52 may be formed using the same conductive layers that also form the conductive interconnect in circuits 22, 24, 26, and 28 of FIG. 1 and circuit 304 of FIG. 4. In addition, conductive layer 49 of electrode 14 and conductive layer 53 of electrode 20 may be formed of the same conductive material at the same step in manufacturing. Likewise, conductive layer 50 of electrode 14 and conductive layer 54 of electrode 20 may be formed of the same conductive material at the same step in manufacturing. Conductive layer 51 of electrode 14 and conductive layer 55 of electrode 20 may be formed of the same conductive material at the same step in manufacturing. And finally, conductive layer 52 of electrode 14 and conductive layer 56 of electrode 20 may be formed of the same conductive material at the same step in manufacturing. In most embodiments, these conductive layers 49-52 are metal (e.g. copper, aluminum, etc); however, alternate embodiments may use any appropriate conductive material or stack of materials. Note that vias 59-61 may be formed using the same conductive layers that also form the conductive vias in circuits 22, 24, 26, and 28 of FIG. 1 and circuit 304 of FIG. 4. In most embodiments, these conductive vias 59-61 are metal (e.g. copper, tungsten, titanium, aluminum, etc); however, alternate embodiments may use any appropriate conductive material or stack of materials.

In the embodiment illustrated in FIG. 2, electrode 20 is electrically coupled to a semiconductor substrate 70 by way of vias 65. In this manner, it is possible to electrically couple the substrate 70 and electrode 20 to a first power supply voltage (e.g. approximately ground). Electrode 14 may be coupled to a second power supply voltage, or to any desired node within functional circuitry (e.g. within circuits 22, 24, 26, and/or 28 of FIG. 1 or within circuit 304 of FIG. 4).

Note that conductor 55 of electrode 20 passes through a gap or opening 31 formed in stack 14 so that stack 20 and stack 14 remain electrically isolated. It is well known in the art how to from such gaps or openings 31 and to run a conductor (e.g. 55) through such gaps or openings 31. Note that one or more such gaps or openings 31 may be formed at any level in the stack (e.g. stack 14), and one or more conductors (e.g. 53-55) may be routed through these gaps or openings. Note that although there are now gaps or openings 31 in stack 14, stack 20 prevents any compromise in the edge seal formed by stacks 14 and 20.

In an alternate embodiment, electrode 20 may comprise any number of stacks. Similarly, electrode 14 may comprise any number of stacks. Note that increasing the number of stacks used to form one or more electrodes may be one technique used to increase the capacitance of the capacitor (e.g. 36, 28, 40) formed by the electrodes.

Figure 3:
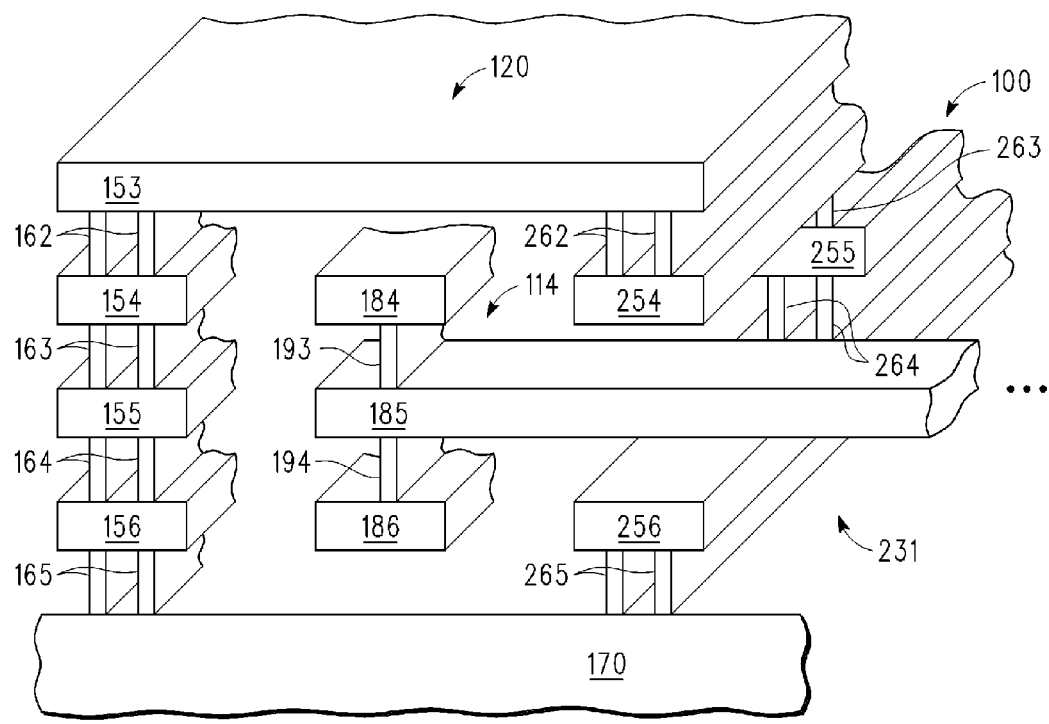
FIG. 3 illustrates, in a cross-sectional view, a portion of an alternate embodiment of a semiconductor device forming a capacitor in accordance with one embodiment of the present invention.

FIG. 3 illustrates, in a cross-sectional view, a portion of an alternate embodiment of a semiconductor device 10 forming a capacitor in accordance with one embodiment of the present invention. Note that in the illustrated embodiment, electrode 120 is formed as two conductive stacks coupled by conductor 153. The first conductive stack comprises a plurality of conductive layers 153-156 which are electrically connected by way of vias 162-165. Note that conductive layers 153-156 may be formed using the same conductive layers that also form the conductive interconnect in circuits 22, 24, 26, and 28 of FIG. 1. In most embodiments, these conductive layers 153-156 are metal (e.g. copper, aluminum, etc); however, alternate embodiments may use any appropriate conductive material or stack of materials. Note that vias 162-165 may be formed using the same conductive layers that also form the conductive vias in circuits 22, 24, 26, and 28 of FIG. 1. In most embodiments, these conductive vias 162-165 are metal (e.g. copper, tungsten, titanium, aluminum, etc); however, alternate embodiments may use any appropriate conductive material or stack of materials. The second conductive stack in electrode 120 comprises a plurality of conductive layers 254-256 which are electrically connected by way of vias 262-265. Note that conductive layers 254-256 may be formed using the same conductive layers that also form the conductive interconnect in circuits 22, 24, 26, and 28 of FIG. 1.

A second capacitive electrode 114 comprises a plurality of conductive layers 184-186 which are electrically connected by way of vias 193-194. Note that conductive layers 184-186 may be formed using the same conductive layers that also form the conductive interconnect in circuits 22, 24, 26, and 28 of FIG. 1. In most embodiments, these conductive layers 184-186 are metal (e.g. copper, aluminum, etc); however, alternate embodiments may use any appropriate conductive material or stack of materials. Note that vias 193-194 may be formed using the same conductive layers that also form the conductive vias in circuits 22, 24, 26, and 28 of FIG. 1. In most embodiments, these conductive vias 193-194 are metal (e.g. copper, tungsten, titanium, aluminum, etc); however, alternate embodiments may use any appropriate conductive material or stack of materials.

In addition, conductive layer 154 of the first stack of electrode 120, conductive layer 254 of the second stack of electrode 120, and conductive layer 184 of electrode 114 may be formed of the same conductive material at the same step in manufacturing. Likewise, conductive layer 155 of the first stack of electrode 120, conductive layer 255 of the second stack of electrode 120, and conductive layer 185 of electrode 114 may be formed of the same conductive material at the same step in manufacturing. And finally, conductive layer 156 of the first stack of electrode 120, conductive layer 256 of the second stack of electrode 120, and conductive layer 186 of electrode 114 may be formed of the same conductive material at the same step in manufacturing.

In the embodiment illustrated in FIG. 3, electrode 120 is electrically coupled to a semiconductor substrate 170 by way of vias 165 and 265. In this manner, it is possible to electrically couple the substrate 170 and electrode 120 to a first power supply voltage (e.g. approximately ground). Electrode 114 may be coupled to a second power supply voltage, or to any desired node within functional circuitry (e.g. within circuits 22, 24, 26, and/or 28 of FIG. 1).

Note that conductor 185 of electrode 114 passes through a gap or opening 231 formed in the second stack of electrode 120 so that electrode 120 and electrode 114 remain electrically isolated. It is well known in the art how to from such gaps or openings 231 and to run a conductor (e.g. 185) through such gaps or openings 231. Note that one or more such gaps or openings 231 may be formed at any level in the stack (e.g. second stack of electrode 120), and one or more conductors (e.g. 184-186) may be routed through these gaps or openings 231. Note that although there are now gaps or openings 231 in the second stack of electrode 120, the first stack of electrode 120 prevents any compromise in the edge seal formed by the first and second stacks of electrode 120 and electrode 114.

In FIG. 3, electrode 120 is illustrated as comprising two stacks and electrode 114 is illustrated as comprising one stack. In alternate embodiments, electrode 120 may comprise any number of stacks. Similarly, in alternate embodiments, electrode 114 may comprise any number of stacks. Note that increasing the number of stacks used to form one or more electrodes may be one technique used to increase the capacitance of the capacitor formed by the electrodes (e.g. electrodes 120 and 114).

FIG. 4 illustrates, in a partial top view and a partial block diagram form, an alternate embodiment of a semiconductor device 300 having an inductor 310 in accordance with one embodiment of the present invention. In the illustrated embodiment, semiconductor device 300 has an edge 302 and an edge seal region around the periphery of the semiconductor device 300 between the edge 302 and the pads 306. In one embodiment, the semiconductor device 300 is an integrated circuit. The periphery of integrated circuit 300 comprises at least one inductor 310. In the illustrated embodiment, inductor 310 also functions as an edge seal 310 which acts as a barrier to prevent cracks or contaminants from propagating past the edge seal 310 into the active circuitry of the die (e.g. functional circuitry 304). Note that in the illustrated embodiment, inductor 310 provides a continuous edge seal barrier to protect the integrity of integrated circuit 300. In alternate embodiments, it may be possible to segment the inductor 310 into a plurality of segments, so long as the outer portion of the edge seal 310 maintains enough integrity to continue to function effectively as an edge seal.

In the illustrated embodiment, inductor 310 is formed having a first terminal 312 and a second terminal 314. In the illustrated embodiment, terminal 312 may be coupled to a first node in functional circuitry 304, and terminal 314 may be coupled to a second node in functional circuitry 304. As a result, inductor 310 may form an inductor between a first node and a second node in functional circuitry 304. In the illustrated embodiment, inductor 310 loops around the periphery of integrated circuit 300 at least once. In the illustrated embodiment inductor 310 is connected to two pads of the integrated circuit. In alternate embodiments either one or neither end of the inductor may be electrically connected to a pad.

Inductor 310 is conductive. The inductance of inductor 310 is determined by a plurality of factors, such as, for example, the length of each segment of inductor 310 in the x and y directions and the number of loops around the periphery of integrated circuit 300. In alternate embodiments, the inductor can be oriented in any desired or appropriate direction with respect to the directions x, y, and z. As an example, in alternate embodiments, the loops may be perpendicular to the x direction, the y direction, or the z direction.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

System 10 or system 300 or portions thereof may be soft or code representations of physical circuitry or of logical representations convertible into physical circuitry. As such, system 10 or 300 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of system 10 or 300, for example, from computer readable media such as memory 35 or other media on other computer systems. Such computer readable media may be permanently, removably or remotely coupled to an information processing system such as system 10. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

Although the invention is described herein with reference to specific embodiments, various modifications and changes can be made without departing from the scope of the present invention as set forth in the claims below. For example, one or more devices (e.g. one or more capacitors) formed as part of the edge seal may be used as functional devices in electrostatic discharge (ESD) protection circuitry. For example, other circuitry 26 or 28 in FIG. 1 may comprise ESD circuitry which is used to protect integrated circuit 10 from ESD events. In addition, an integrated circuit (e.g. 10, 300) may have any number of capacitors (e.g. 36, 38, 40) and/or any number of inductors (e.g. 310) which are coupled to functional circuitry (e.g. circuits 22, 24, 26, 28, 304), wherein the capacitors and/or inductors also serve the purpose of acting as part of an edge seal (e.g. 14, 16, 18, 20; 310). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A method comprising:
   providing an integrated circuit having a plurality of terminals for making electrical connection to the integrated circuit;
   providing at least one device adjacent an outer edge of the integrated circuit, the at least one device comprising at least one metal conductor for forming an edge seal for protecting the integrated circuit during die singulation; and
   coupling the at least one device to one or more functional circuits within the integrated circuit by routing the at least one metal conductor to the one or more functional circuits, the at least one device providing a reactance value to the one or more functional circuits for non-test operational use.

2. The method of item 1 further comprising:
   forming the at least one device as a capacitor that couples capacitance to the one or more functional circuits during a non-test operation of the integrated circuit.

3. The method of item 1 further comprising:
   forming the at least one device as an inductor that couples inductance to the one or more functional circuits during a non-testing operation of the integrated circuit.

4. The method of item 3 further comprising:
   forming the inductor with a continuous metal conductor having a first end electrically connected to a first terminal of a predetermined one of the one or more functional circuits and a second end electrically connected to a second terminal of the predetermined one of the one or more functional circuits, the inductor looping between the outer edge and the plurality of terminals at least around the integrated circuit once.

5. The method of item 1 further comprising:
   forming the at least one device as a plurality of capacitors that each couples capacitance to any of the one or more functional circuits during non-testing operation of the integrated circuit.

6. The method of item 1 wherein providing at least one device further comprises:
   forming a plurality of capacitors comprising a common first electrode, the common first electrode comprising a continuous outer metal conductor around the outer edge of the integrated circuit, and forming a plurality of second electrodes of the plurality of capacitors, the plurality of second electrodes comprising an electrically discontinuous inner metal conductor located between the plurality of terminals and the first electrode.

7. A method comprising:
   providing an integrated circuit having a plurality of terminals for making electrical connection to the integrated circuit;
   providing at least one device adjacent a periphery of the integrated circuit, a portion of the at least one device comprising a first metal conductor extending entirely around the integrated circuit to form an edge seal for protecting the integrated circuit during die singulation; and
   coupling the at least one device to a functional circuit within the integrated circuit by routing the first metal conductor to the functional circuit, the functional circuit implementing non-test functions within the integrated circuit by using the at least one device.

8. The method of item 8 further comprising:
   forming the at least one device between an outer edge of the integrated circuit and the plurality of terminals.

9. The method of item 8 further comprising:
   forming the at least one device as a capacitor.

10. The method of item 8 further comprising:
    forming the at least one device as an inductor.

11. The method of item 10 further comprising:
    forming the inductor with a continuous metal conductor having a first end electrically connected to a first terminal of the functional circuit and a second end electrically connected to a second terminal of the functional circuit, the inductor looping around the periphery of the integrated circuit at least once.

12. The method of item 7 further comprising:
    forming the at least one device as a plurality of capacitors comprising a common first electrode comprising a continuous outer metal conductor around the periphery of the integrated circuit, and a plurality of second electrodes of the plurality of capacitors comprising an electrically discontinuous metal conductor located between the plurality of terminals and the first electrode.

13. An integrated circuit comprising:
    at least one device adjacent an outer edge of the integrated circuit, the at least one device comprising a metal conductor surrounding the outer edge of the integrated circuit for forming an edge seal for protecting the integrated circuit during die singulation; and
    a functional circuit within the integrated circuit having a first terminal connected to a first portion of the at least one device and having a second terminal connected to a second portion of the at least one device, the at least one device providing a reactance value to the functional circuit for non-test operational use by the functional circuit.

14. The integrated circuit of item 13 wherein the at least one device is an inductor comprising a stack of conductive layers.

15. The integrated circuit of item 14 wherein the stack of conductive layers of the inductor loops within the outer edge of the integrated circuit more than three hundred sixty degrees.

16. The integrated circuit of item 13 wherein the at least one device is a capacitor.

17. The integrated circuit of item 16 wherein the capacitor further comprises:
    a first metal electrode encircling the outer edge of the integrated circuit and having at least one opening, the first metal electrode connected to the functional circuit at the first terminal, the first metal electrode having an opening therein within a portion that encircles the outer edge of the integrated circuit, the first metal electrode forming a first electrode of the capacitor that is connected to the functional circuit; and
    a second metal electrode encircling the outer edge of the integrated circuit between the outer edge and the first metal electrode, the second metal electrode extending through the opening of the first metal electrode and connecting to the functional circuit to function as a second electrode of the capacitor.

18. The integrated circuit of item 17 wherein the opening within the first metal electrode is formed only through an underlying portion of the first metal electrode.

19. The integrated circuit of item 13 wherein the at least one device further comprises a plurality of capacitors, each coupling capacitance to the functional circuit during non-testing operation of the integrated circuit.

20. The integrated circuit of item 13 further comprising
a plurality of capacitors comprising a common first electrode comprising a continuous outer metal conductor around the outer edge of the integrated circuit, and a plurality of second electrodes of the plurality of capacitors comprising an electrically discontinuous inner metal conductor separated from the first electrode by a dielectric.

What is claimed is:

1. An integrated circuit comprising:
   at least one device adjacent an outer edge of the integrated circuit, wherein the at least one device comprises a plurality of capacitors that includes:
      a continuous outer metal conductor around the outer edge of the integrated circuit for forming an edge seal for protecting the integrated circuit during die singulation and for functioning as a common first electrode, and
      a plurality of second electrodes, the plurality of second electrodes comprising an electrically discontinuous inner metal conductor located between the plurality of pads and the first electrode; and
   a functional circuit within the integrated circuit having a first terminal connected to a first portion of the at least one device and having a second terminal connected to a second portion of the at least one device, the at least one device providing a reactance value to the functional circuit for non-test operational use by the functional circuit.

2. The integrated circuit of claim 1 wherein the plurality of capacitors each couple capacitance to the functional circuit during non-testing operation of the integrated circuit.

3. An integrated circuit comprising:
   a functional circuit having a first terminal and a second terminal; and
   a capacitor adjacent an outer edge of the integrated circuit, the capacitor providing a reactance value to the functional circuit for non-test operational use by the functional circuit, and the capacitor including:
      a first metal electrode encircling the outer edge of the integrated circuit and having at least one opening, the first metal electrode connected to the functional circuit at the first terminal, the first metal electrode having an opening therein within a portion that encircles the outer edge of the integrated circuit, the first metal electrode forming a first electrode of the capacitor that is connected to the functional circuit, and
      a second metal electrode encircling the outer edge of the integrated circuit between the outer edge and the first metal electrode, the second metal electrode forming an edge seal for protecting the integrated circuit during die singulation, and extending through the opening of the first metal electrode and connecting to the functional circuit to function as a second electrode of the capacitor.

4. The integrated circuit of claim 3 wherein the opening within the first metal electrode is formed only through an underlying portion of the first metal electrode.

5. An integrated circuit comprising:
   a plurality of terminals for making electrical connection to the integrated circuit;
   at least one device adjacent an outer edge of the integrated circuit, the at least one device comprising at least one metal conductor and a plurality of capacitors, wherein the at least one metal conductor is for forming an edge seal for protecting the integrated circuit during die singulation, and the plurality of capacitors comprises a common first electrode and a plurality of second electrodes, the common first electrode comprising a continuous outer metal conductor around the outer edge of the integrated circuit, and the plurality of second electrodes comprising an electrically discontinuous inner metal conductor located between the plurality of terminals and the first electrode; and
   one or more functional circuits within the integrated circuit, wherein the one or more functional circuits are coupled to the at least one device with the at least one metal conductor, and wherein the at least one device provides a reactance value to the one or more functional circuits for non-test operational use.

6. The integrated circuit of claim 5 wherein the at least one device further comprises:
   an inductor that couples inductance to the one or more functional circuits during a non-testing operation of the integrated circuit.

7. The integrated circuit of claim 6 wherein the inductor comprises:
   a continuous metal conductor having a first end electrically connected to a first terminal of a predetermined one of the one or more functional circuits and a second end electrically connected to a second terminal of the predetermined one of the one or more functional circuits, the inductor looping at least once around the integrated circuit between the outer edge and the plurality of terminals.

8. The integrated circuit of claim 5, wherein each of the plurality of capacitors couples a capacitance to any of the one or more functional circuits during non-testing operation of the integrated circuit.

9. The integrated circuit of claim 5 wherein the at least one device is formed between an outer edge of the integrated circuit and the plurality of terminals.

10. The integrated circuit of claim 5, wherein the common first electrode is coupled to a first power supply pad, and one of the plurality of second electrodes is coupled to a second power supply pad.

11. An integrated circuit comprising:
    a plurality of terminals for making electrical connection to the integrated circuit;
    at least one device adjacent a periphery of the integrated circuit, wherein the at least one device comprises a first metal conductor and a plurality of capacitors, wherein the first metal conductor extends entirely around the integrated circuit to form an edge seal for protecting the integrated circuit during die singulation, and the plurality of capacitors comprises a common first electrode and a plurality of second electrodes, wherein the common first electrode comprises a continuous outer metal conductor around the periphery of the integrated circuit, and the plurality of second electrodes comprises an electrically discontinuous metal conductor located between the plurality of terminals and the first electrode; and
    a functional circuit within the integrated circuit coupled to the at least one device by routing between the first metal conductor and the functional circuit, the functional circuit implementing non-test functions within the integrated circuit by using the at least one device.

12. The integrated circuit of claim 11 wherein the at least one device is formed between an outer edge of the integrated circuit and the plurality of terminals.

13. The integrated circuit of claim 11 wherein the at least one device further comprises:
   an inductor.

14. The integrated circuit of claim 13 wherein the inductor comprises:
   a continuous metal conductor having a first end electrically connected to a first terminal of the functional circuit and a second end electrically connected to a second terminal of the functional circuit, the inductor looping around the periphery of the integrated circuit at least once.

15. The integrated circuit of claim 13 wherein the inductor couples inductance to the one or more functional circuits during a non-testing operation of the integrated circuit.

16. The integrated circuit of claim 11, wherein the common first electrode is coupled to a first power supply pad, and one of the plurality of second electrodes is coupled to a second power supply pad.

* * * * *